United States Patent [19]
Iwamoto et al.

[11] Patent Number: 5,483,343
[45] Date of Patent: Jan. 9, 1996

[54] WAVELENGTH COMPENSATOR IN A HELIUM AMBIENCE

[75] Inventors: Kazunori Iwamoto, Yokohama; Kenji Saitoh, Atsugi; Hiroshi Osawa, Yokohama, all of Japan

[73] Assignee: Canon Kabushiki Kaisha, Tokyo, Japan

[21] Appl. No.: 269,386

[22] Filed: Jun. 30, 1994

[30] Foreign Application Priority Data

| Jun. 20, 1993 | [JP] | Japan | 5-160883 |
| Sep. 22, 1993 | [JP] | Japan | 5-236169 |
| Apr. 25, 1994 | [JP] | Japan | 6-086406 |

[51] Int. Cl.⁶ .................................................. G01B 9/02
[52] U.S. Cl. .......................... 356/351; 356/361; 356/349
[58] Field of Search ........................ 356/345, 349, 356/351, 358, 361

[56] References Cited

U.S. PATENT DOCUMENTS

| 4,571,082 | 2/1986 | Downs | 356/361 |
| 4,733,967 | 3/1988 | Sommargren | 356/361 |
| 4,814,625 | 3/1989 | Yabu | 356/358 |

OTHER PUBLICATIONS

Norton, Francis J., "Permeation of Gases through Solids," *Journal of Applied Physics*, vol. 28, No. 1, Jan. 1957, pp. 34–39.

Primary Examiner—Samuel A. Turner
Assistant Examiner—Robert Kim
Attorney, Agent, or Firm—Fitzpatrick, Cella, Harper & Scinto

[57] ABSTRACT

A wavelength compensator includes a reference vacuum tube having closed ends, wherein a laser beam enters the reference vacuum tube from one of the ends thereof and is reflected by the other end backwardly, an interference device for causing interference of the laser beam to produce an interference beam, and a light receiving device for receiving the interference beam which bears information related to a change in wavelength of the laser beam. The wavelength compensator further includes a specific arrangement which is effective to reduce vacuum deterioration of the reference vacuum tube.

13 Claims, 8 Drawing Sheets

WAVELENGTH COMPENSATOR IN A HELIUM AMBIENCE

FIELD OF THE INVENTION AND RELATED ART

This invention relates to a wavelength compensator for correcting a measurement error of a laser interferometer measuring device, for measuring distance or angle, for example, due to a change in wavelength of light used for the measurement. In another aspect, the invention is concerned with various systems that use such a wavelength compensator.

Laser interferometer measuring device is used widely in many fields, such as for positioning a stage in a semiconductor device manufacturing apparatus, for example.

Figure 8:
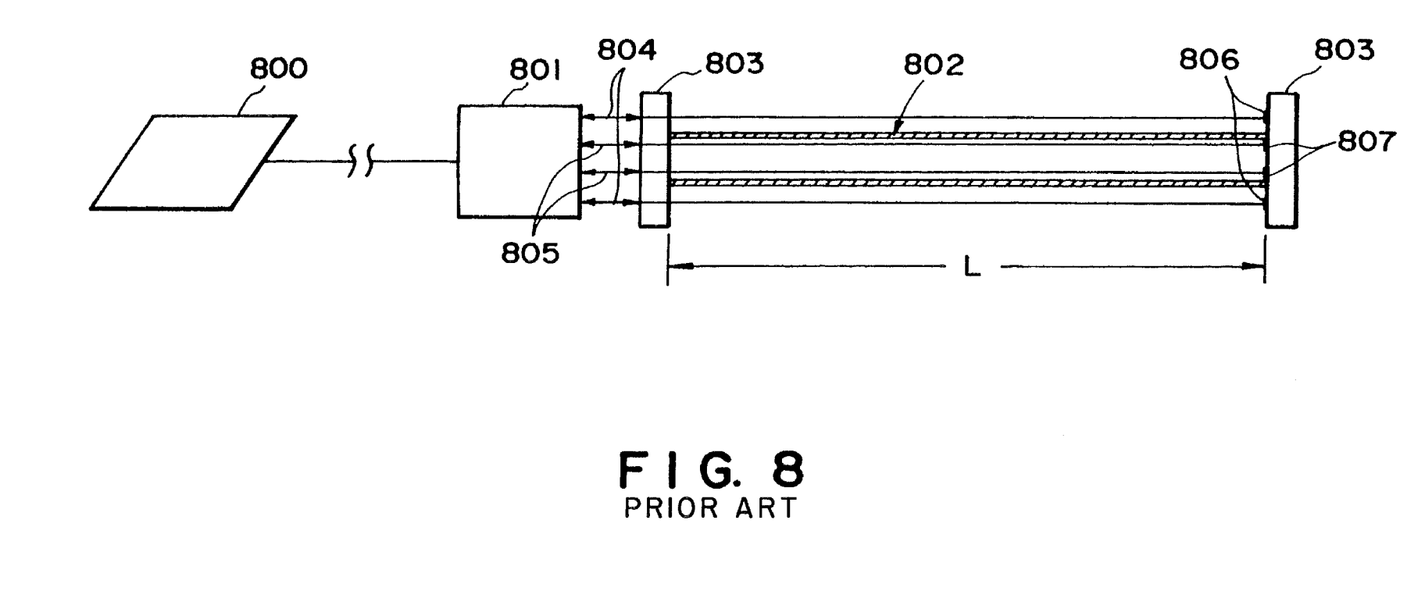
FIG. 8 is a schematic view of a known type wavelength compensator.

A change in ambience (pressure, temperature or humidity) through which measuring light of a laser interferometer measuring means passes, causes a change in wavelength of the measuring light which adversely affects the high precision measurement. A wavelength compensator is used as a mechanism for compensating the effect of the change of the wavelength. FIG. 8 shows a known type wavelength compensator. Denoted at 800 in the drawing is a laser tube (laser light source) of a laser interferometer device. The laser beam emitted from it is divided. Denoted at 801 is a differential plane mirror type interferometer. Denoted at 802 is a reference vacuum tube which is made of fused silica. Denoted at 803 are flanges made of fused silica, which are provided at the opposite ends of the reference vacuum tube 802. Denoted at 804 are measuring beams, and denoted at 805 are reference beams. Denoted at 806 are target mirrors disposed in an ambience, and denoted at 807 are target mirrors disposed in a vacuum.

In response to reception of a laser beam from the laser beam 800, the interferometer 801 produces the measuring beams 804 and the reference beams 805 each being spatially separated from the others. The measuring beams 804 pass through the flange 803 and through the ambience and they impinge on and are reflected by the target mirrors 806 which are mounted on the flange 803 and placed in the ambience. Because of double path structure, the beams pass twice along different paths and go back to the interferometer 801. On the other hand, the reference beams 805 pass through the flange 803 and through the inside of the reference vacuum tube 802, and they impinge on and are reflected by the target mirrors 807 which are mounted on the flange 803 and placed in the vacuum. Also because of double path structure, the reference beams pass along different paths and go back to the interferometer 801. Here, the target mirrors 806 and 807 are so disposed that the same optical path length is defined with respect to each of the measuring beams 804 and the reference beams 805. Thus, in the interferometer 801, interference of the measuring beams 804 and the reference beams 805 is produced. The resultant interference beam bears information related to a change in wavelength of the laser beam.

The operation theory of wavelength compensation will now be explained.

If the interval between the flanges 803 of the reference vacuum tube is denoted by L, as shown in FIG. 8, the optical path length of each of the measuring beams 804 ed the reference beams 805 is equal to 4L. If the initial refractive index of the ambience outside the reference vacuum tube 802 is $n_0$ and the refractive index within the reference vacuum tube 802 is 1, then and optical path difference $D_0$ between the measuring beam 804 and the reference beam 805 is given by:

$$D_0 = 4L(n_0 - 1) \qquad (1)$$

Here, if, due to a change in ambience, the refractive index of the ambience outside the reference vacuum tube 802 changes to $n_1$, then the optical path difference between the measuring beam 804 and the reference beam 805 changes to $D_n$ which is given, by:

$$D_n = 4L(n_1 - 1) \qquad (2)$$

From equations (1) and (2), the change $D_c$ in optical path difference is given by:

$$\begin{aligned} D_c &= D_n - D_0 \\ &= 4L(n_1 - n_0) \end{aligned} \qquad (3)$$

On the other hand, the difference $D_e$ in optical path difference upon the measuring circuit of the wavelength compensator is given by:

$$D_e = N\lambda_v/(2m-1) \qquad (4)$$

where N is and integration count, $\lambda_v$ is the wavelength of the laser in the vacuum, and m is the bit number of and A/D (analog-to-digital) converter. Theoretically, $D_c = D_e$ and, therefore, from equations (3) and (4), it follows that:

$$n_1 = n_0 + [N\lambda_v/4L(2m-1)] \qquad (5)$$

Further, if the wavelength of the laser as the refractive index is equal to $n_1$ is denoted by $\lambda_{n1}$, then $$\lambda n1 = \lambda_v/n_1 \qquad (6)$$

From equations (5) and (6), the wavelength attributable to the ambience change is calculated and, on the basis of this, the measured value of the laser interferometer measuring device is corrected. By this, the measurement precision is held.

In the wavelength compensator described above, the wavelength correction is performed on an assumption that the inside of the reference vacuum tube made of fused silica is maintained at vacuum and that the refractive index is held at 1.

On the other hand, it is known that, with respect to helium, the fused silica has a permeation coefficient which is larger by not less than seven figures than that of nitrogen or oxygen. For example, as discussed in "Laser Handbook", 1973, page 188, by Inaba et, al, published by Asakura Shoten, Japan, even in the case of He—Ne laser having helium tightly contained, in the early period, fused silica was used in many cases as the material of fine laser tube. However, inconveniences of large helium transmissivity of the fused silica have been recognized, and recently borosilicated glass has been used widely. Transmission coefficients of materials to rare gas such as helium arc discussed in detail in "Permeation of Gases through Solids", by F. J. Norton, "Journal of Applied Physics", 1957, pp. 34–39.

Since the compensator of the type describe above uses a vacuum tube made of fused silica, if the wavelength compensator is placed in a helium ambience, the helium permeates through the fused silica and, as a result, the degree of vacuum within the vacuum tube decreases. This causes a change in refractive index in the tube. Thus, errors are produced in the values of equations (1)–(6), and the positioning precision during the positioning operation based on the laser interferometer measuring device is degraded.

For example, during a period in which the refractive index of the ambience changes from $n_O$ to $n_1$, due to the helium leakage the refractive index within the vacuum tube may change from 1 to $1+\Delta_n$. As a result of this, the optical path difference $D_n(He)$ between the measuring beam and the reference beam as the helium leakage occurs may be:

$$D_n(He) = 4L(n_1 - 1 - \Delta_n) \tag{7}$$

From equations (1) and (7), the change $D_c$ in optical path difference due to a change in ambience is given by:

$$D_c(He) = D_n(He) - D_0 \tag{8}$$
$$= 4L(n_1 - \Delta_n - n_0)$$

The refractive index $n_1(He)$ within the helium ambience as given by equation (5) and the wavelength $\lambda_{n1}(He)$ of the laser at that time are represented by:

$$n_1(he) = n_0 + \Delta_n + [N\lambda_v/4L\ (2m-1)] \tag{9}$$

$$\lambda_{n1}(he) = \lambda_v/n_1(he) \neq \lambda_v/n_1 \tag{10}$$

Thus, in the helium ambience, exact correction of measured value is difficult to perform.

SUMMARY OF THE INVENTION

It is accordingly and object of the present invention to provide an improved wavelength compensator by which correct measurement through a laser interferometric measurement device is assured without being affected by and ambience in which the device is used.

It is another object of the present invention to provide a stage device or and exposure system, for example, which uses a wavelength compensator such as described above.

In accordance with and aspect of the present invention, there is provided a wavelength compensator, comprising a reference vacuum tube having closed ends, wherein a laser beam enters the reference vacuum tube from one of the ends thereof and is reflected by the other end backwardly; interference means for causing interference of the laser beam to produce and interference beam; receiving means for receiving the interference beam which bears information related to change in wavelength of the laser beam: and means for reducing deterioration in vacuum of the reference vacuum tube.

The interference means may serve to divide a laser beam into a reference beam passing through the reference vacuum tube and a measuring beam not passing through the reference vacuum tube, and to cause interference between the reference beam and the measuring beam.

The deterioration reducing means may include vacuum evacuating means mounted on the reference vacuum tube.

The deterioration reducing means may use, as a material of the reference vacuum tube, material having a small helium permeation coefficient as compared with that of fused silica.

The used material may comprise a glass material having a small helium permeation coefficient as compared with that of used silica.

The used material may comprise a metal material having a small helium permeation coefficient as compared with that of fused silica, and a portion of the vacuum tube to be passed by the laser beam may be made of a material through which the laser beam can pass while another portion of the vacuum tube may be made of the metal material.

The deterioration reducing means may comprise a coating material applied to the surface of the vacuum tube, the coating material comprising a material having a small helium permeation coefficient as compared with that of fused silica.

The coating material may comprise a glass material having a small helium permeation coefficient as compared with that of fused silica.

The coating material may comprise a metal material having a small helium permeation coefficient as compared with that of fused silica, and a portion of the vacuum tube to be passed by the laser beam may be made of a material through which the laser beam can pass while another portion of the vacuum tube may be made of the metal material.

The vacuum tube may comprise a multiplex structure by which said deterioration reducing means is defined.

In accordance with another aspect of the present invention, there is provided a laser interferometer measuring device, comprising measuring means for measuring a relationship of objects by using a laser beam; and a wavelength compensator such as recited above, for compensating a measurement error due to a change in wavelength of the laser beam.

In accordance with a further aspect of the present invention, there is provided a stage device comprising a movable stage on which and object can be placed: and a laser interferometer measuring device such as described above.

In accordance with a still further aspect of the present invention, there is provided and exposure system, comprising an exposure apparatus for exposing a substrate to be exposed: and a stage device such as described above, on which the substrate to be exposed can be placed.

In accordance with a yet further aspect of the present invention, there is provided a microdevice which is manufactured by using and exposure system such as described above.

In a wavelength compensator of the present invention, a laser beam (reference beam) passing through a reference vacuum tube and a laser beam (measuring beam) not passing through the reference vacuum tube are caused by interference beam to interfere with each other and then are received by light receiving means. Interference beam produced by the interference means bears information related to a change in wavelength resulting from a change in ambience. On the basis of this information, a measured value of and associated laser interferometric measuring means is corrected. The wavelength compensator is provided with means for reducing vacuum deterioration of the reference vacuum tube, and the vacuum within the vacuum tube can be maintained irrespective of the ambience around it. Therefore, compensation of a change in wavelength of the laser beam attributable to a change in ambience can be performed exactly in accordance with the theoretical equations.

The vacuum deterioration reducing means may comprise a vacuum evacuation means and, in that occasion, the inside of the reference vacuum tube is forced to be evacuated by which the vacuum of the reference vacuum tube can be maintained. The vacuum deterioration reducing means may comprise a material having a small helium permeation coefficient as compared with that of fused silica, which material may be used to form the reference vacuum. Alternatively, the surface of the reference vacuum tube may be coated with such material, As the vacuum deterioration reducing means, the reference vacuum tube may comprise a multiplex or multicylinder structure. In that occasion, leakage of helium into the reference vacuum tube placed in a helium ambience is reduced, whereby the vacuum of the reference vacuum tube can be maintained.

A laser interferometric measurement device according to the present invention uses a wavelength compensator such as described above, and correct measurement is assured without being affected by a change in ambience.

In a stage device according to the present invention, the positional information of a stage is measured by using a interferometric measurement device such as described above. Thus, higher precision positioning of the stage is assured.

An exposure system according to the present invention uses a stage device such as described above, for carrying thereon a substrate to be exposed. Thus, higher precision positioning of the substrate is assured and production of microdevices of higher degree integration is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be explained in conjunction with the attached drawings.

[First embodiment]

Figure 1:
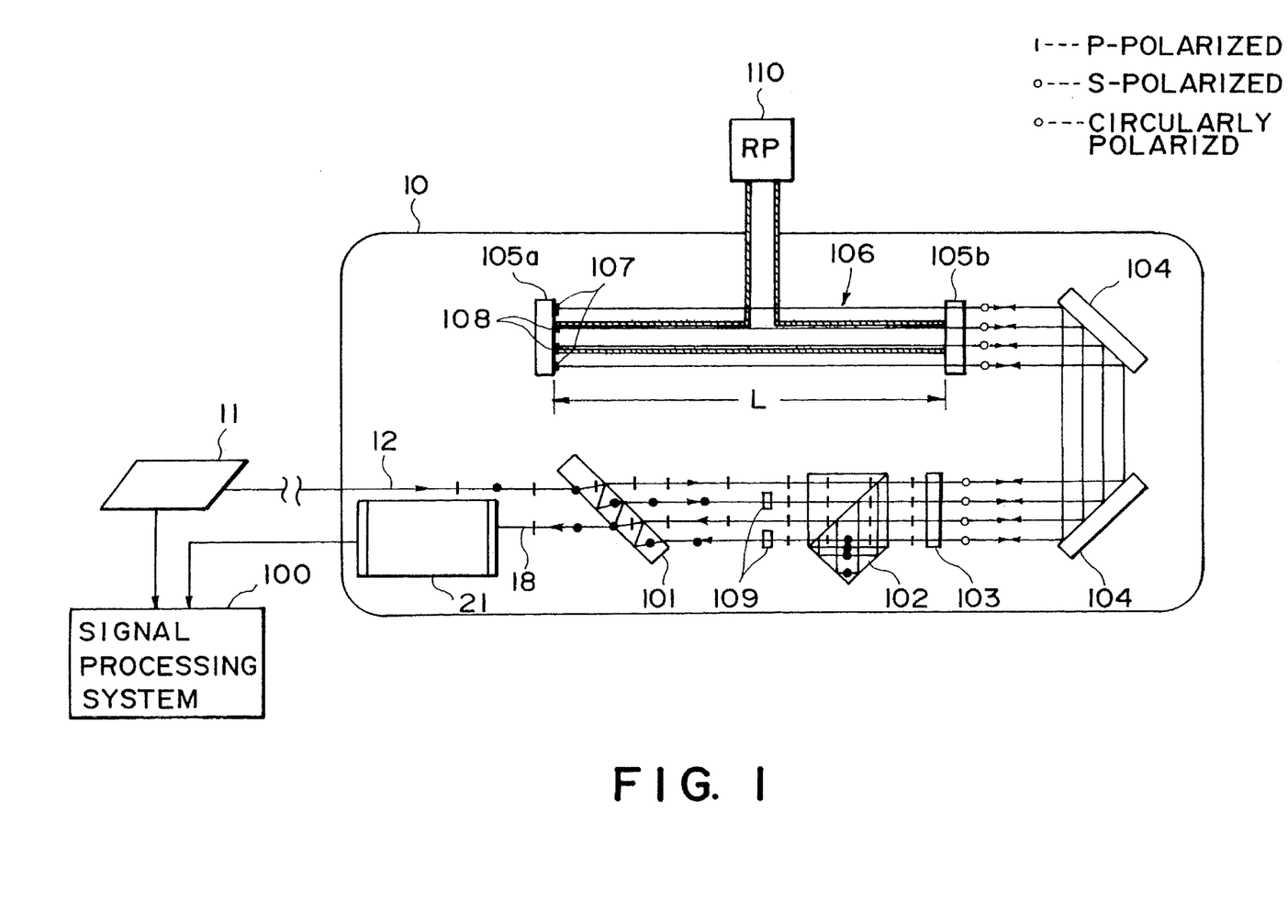
FIG. 1 is a schematic view of a wavelength compensator according to a first embodiment of the present invention.

FIG. 1 is a schematic view of a wavelength compensator according o a first embodiment of the present invention.

FIG. 1 shows a unit of wavelength compensator 10 which comprises a polarization sheer plate 101 for optically bisecting a laser beam 12 produced by a laser tube 11, having two wavelength components of different states of polarization. The polarization sheer plate 101 also serves as interference means for causing interference of the divided beams. The wavelength compensator 10 further comprises and interferometer 102, a quarter wave plate 103 for transforming a beam of P-polarized component coming from the interferometer 102 into a circularly polarized component, two bender mirrors 104 for beam deflection, and a reference vacuum tube 106 made of fused silica. The opposite ends of the reference vacuum tube 106 are tightly closed by flanges 105a and 105b, respectively, each being made of fuse silica. The wavelength compensator further comprises half wave plates 109 each disposed between the polarization sheer plate 101 and the interferometer 102, for transforming a beam of S-polarized component coming from the polarization sheer plate 101 into a beam of P-polarized component which in turn is directed to the interferometer or for transforming a beam of P-polarized component coming from the interferometer 102 into a beam of S-polarized component which in turn is directed to the polarization sheer plate 101. The wavelength compensator further comprises a receiver (light receiving means) 21 for transforming and interference beam 18 coming from the polarization sheer plate 101 into and electric signal which in turn is applied to a signal processing system 100.

Mounted to one (105a) of the flanges 105a and 105b of the reference vacuum tube 106, are target mirrors 107 placed in and ambience, as well as target mirrors 108 placed in a vacuum. The inside of the reference vacuum tube 106 evacuated by means of a vacuum pump 110, whereby the state of vacuum is maintained. Of the structure described above and along the beam paths, the portion from the polarization sheer plate 101 to the bender mirror 104, inclusive, provides a correction interferometer.

With the arrangement described above, the components of the laser beam 12 produced by the laser tube 11 and having two different frequency components (f1 and f2), being orthogonally polarized, is optically divided by the polarization sheer plate 101. The divided components go along two different paths of the same path length, and then they are recombined upon the polarization sheer plate 101, whereby and interference beam 18 is produced. The interference beam 18 is then received by the receiver 21.

Here, of thee two optical paths, the one along which the frequency component f1 goes will first be explained. The component f1 (P-polarized light) separated by the polarization sheer plate 101 goes through the interferometer 102 and, thereafter, it passes through the quarter wave plate 103 by which it is transformed into circularly polarized light. Subsequently, it is deflected backwardly by the two bender mirrors 104 and passes through the flange 105b of the reference vacuum tube 106. Then, it is reflected by the target mirror 107 placed in the ambience. The returning light goes back to the interferometer 102 and is reflected by a corner cube of the interferometer 102 such that it is directed to the target mirror along a different light path. Then it goes back again to the interferometer 102. After passing the interferometer 102, it goes through the half wave plate 109 by which it is transformed into S-polarized light which in turn is projected to the polarization sheer plate 101.

Similarly to the component f1, the frequency component f2 (S-polarized light) is projected and reflected along paths (double paths). What differs from the component f1 is that the component f2 goes through the inside of the reference vacuum tube 106 and impinges of the target mirror 108 disposed in a vacuum.

These returning lights incident on the polarization sheer plate 101 are combined with each other on this polarization sheer plate 101, whereby and interference beam 108 is produced which in turn is received by the receiver 21.

Here, the vacuum ambience within the reference vacuum tube 106 is normally evacuated at least during the operation by means of the vacuum pump 110, such that the refractive index is held constant at 1. This is and important feature of the present embodiment. Namely, the vacuum evacuating means including the vacuum pump 110 serves as means for reducing vacuum deterioration of the reference vacuum tube 106, such tat a high precision wavelength compensator is assured.

The frequency (beat frequency) of the interference beam 18 corresponds to the difference ($-|f1-f2|$) between the two frequencies of the laser. Here, if there occurs fluctuation of pressure, temperature or humidity of the ambience around the wavelength compensator, due to the Doppler effect ($f1 \pm \Delta f1$) there occurs a Doppler shift of $\Delta f1$ in the frequency $f1$. As a result, the frequency of the interference beam 18 change to $\{f2(-f1 \pm \Delta f1)\}$. Such shift is detected by a photodetector within the receiver 21, and is transformed into an electric signal which in turn is applied to the signal processing system 100.

On the other hand, a frequency shifter is provided in the laser tube 11 and it produces a reference signal of stable frequency. In the signal processing system 100, a phase difference between this reference signal and the measurement signal applied thereto as described is sampled by means of a analog-to-digital (A/D) converter, and is added to an accumulator. The accumulated value corresponds to the integrated count N of equation (4) mentioned hereinbefore, and the wavelength resulting from the ambience change is calculated in accordance with equations (5) and (6) mentioned hereinbefore. Here, as described, the inside vacuum condition of the reference vacuum tube 110 is maintained, the refractive index is held at 1 irrespective of the fact that the reference vacuum tube 106 as well as flanges 105a and 105b are made of fused silica and regardless of the ambience around it. As a result, the wavelength attributable to the change in ambience can be calculated correctly just in accordance with the theoretical equations and on the basis of it, exact correction of measured value of the laser interferometric measurement device can be performed.

Figure 2:
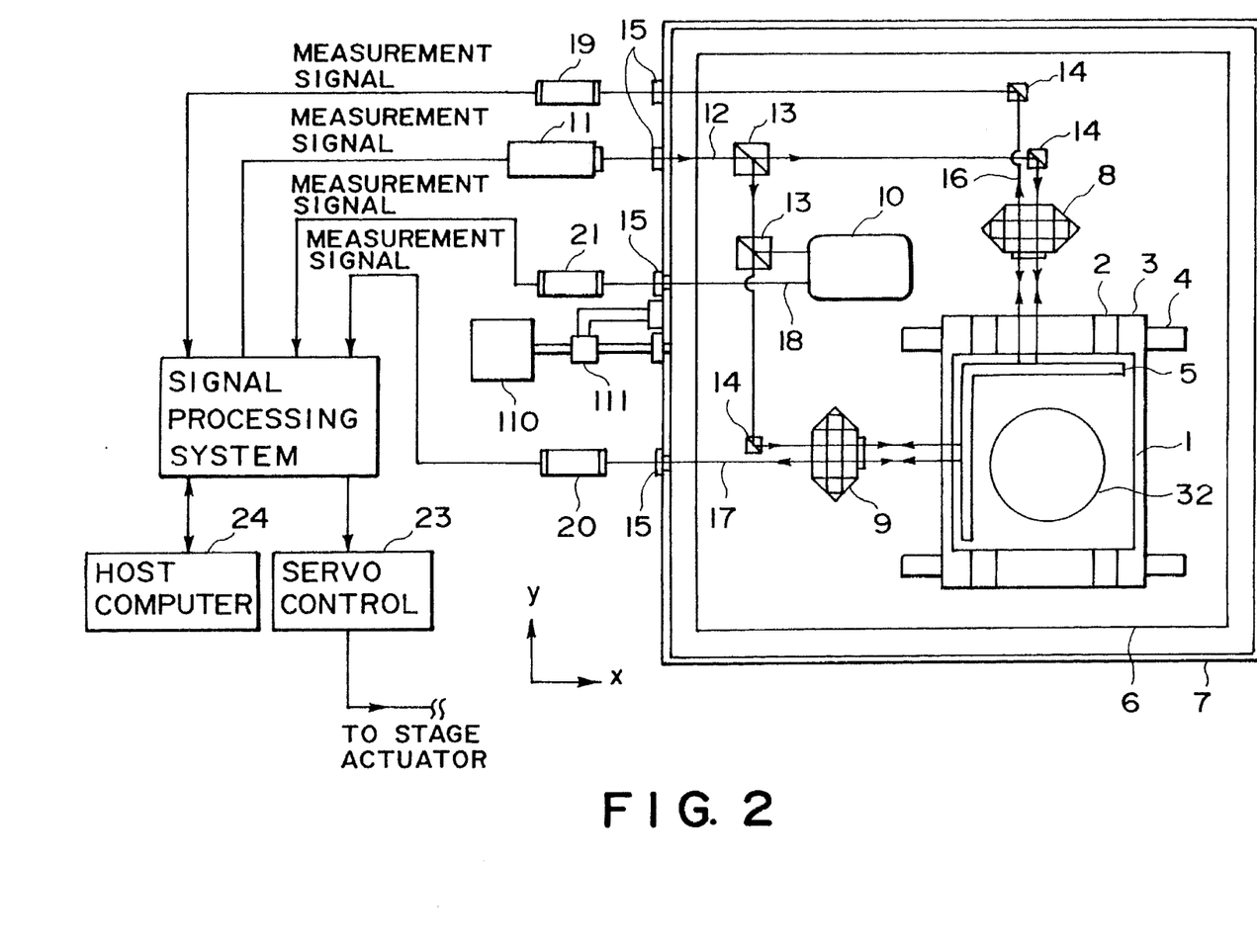
FIG. 2 is a schematic view of an exposure system according to a second embodiment of the present invention, in which the wavelength compensator of FIG. 1 is incorporated.

Referring now to FIG. 2, and exposure system using a wavelength compensator such as described above will be explained, This exposure system comprises a stage device having a stage on which a substrate to be exposed is placed. The stage is movable, and the positional information of the stage is measured by a laser interferometric measurement device. The exposure system further comprises and exposure apparatus, not shown in FIG. 2. The laser interferometric measurement device includes measuring means for measuring the relative position of the stage by using a laser beam, and a wavelength compensator for correcting a measurement error due to a change in wavelength of the laser beam. As for this wavelength compensator, one such as described with reference to FIG. 1 in used. However, a different wavelength compensator such as one to be describe later with reference to other embodiments of the present invention may he used in this exposure system.

FIG. 2 is a schematic view of this exposure system. As illustrated, a stage base 6 is disposed in a He chamber 7. Mounted on this stage base 6 are an X stage 3 movable in X direction while being guided by and X stage guide 4, a Y stage 1 movable in Y direction while being guided by a Y stage guide 2, and a wafer chuck 32 supported by the X stage and the Y stage, for holding thereon an unshown wafer (substrate to be exposed). L-shaped square mirror 5 to be used for the positioning of the X stage 3 and Y stages 1, is fixedly mounted on the Y stage 1. Y-axis distance measurement plane mirror interferometer 8 for measuring the distance to the L-shaped square mirror 5 in the Y direction as well as X-axis distance measurement plane mirror interferometer 9 for measuring the distance to the L-shaped mirror 5 in the X direction, are disposed in the He chamber 7.

Laser tube 11 is disposed outside the He chamber 7, and it produces a laser beam 12 having two frequency components. The laser beam 12 emitted by the laser tube enters the He chamber 7 through a glass window 15 provided in the wall of the chamber 7. The laser beam is then bisected by a beam splitter 13. The divided beams are reflected by respective bender mirrors 14, and the reflected beams are received by the Y-axis distance measurement plane mirror interferometer 8 and the X-axis distance measurement plane mirror interferometer 9, respectively, Signal processing circuit 22 produces and electrical reference signal in response to a signal from a host computer 24 which serves to control the positioning of the X stage 3 and Y stage 1. This reference signal is applied to the laser tube 11, on the basis of which the laser tube produces the laser beam 12.

Interference beam 16 from the Y-axis interferometer 8 is reflected by the bender mirror 14 and, after passing the glass window 15, it is received by a receiver 19. Similarly, interference beam 17 from the X-axis interferometer 9 passes the glass window 15 and is received by a receiver 20. These two receivers 19 and 20 serve to transform the received interference beams 16 and 17 into electrical measurement signals, respectively, which are then applied to the signal processing circuit 22. Servo control circuit 23 produces a pulse signal in response to an output of the signal processing circuit, which pulse signal is applied to stage actuator means (not shown) for moving the X stage 3 and Y stage 1.

For compensation of a change in wavelength of the measurement light of the X-axis interferometer 8 and/or the Y-axis interferometer 9 resulting from a change in ambience within the He chamber 7, a wavelength compensator 10 of the structure described with reference to FIG. 1 is disposed in the He chamber 7. To this wavelength compensator 10, a laser beam 12 produced by the laser tube 11 and reflected by beam splitters 13 is projected. Interference beam 18 from the wavelength compensator 10 goes through a glass window 15, and it is received by a receiver 21. The receiver 21 transforms the received light into an electrical measurement signal which in turn is applied to the signal processing circuit 22.

Evacuation pump 110 for evacuating a reference vacuum tube 106 (FIG. 1) of the wavelength compensator 10 is disposed outside the He chamber 7. The evacuation pump 110 functions not only to evacuate the reference vacuum tube 106 but also to evacuate the He chamber so as to control the He gas within the chamber 7 or to increase the chamber background purity. To this end, there is a switching valve 111 for interchanging the evacuation of the reference vacuum tube 106 and the evacuation of the He chamber 7.

As seen from the foregoing description, the measuring means for measuring the relative position of the stage by using a laser beam comprises the laser tube 11, the Y-axis interferometer 8, the X-axis interferometer 9 and the L-shaped square mirror 5. Laser interferometric measurement device is provided by combination of these components with the wavelength compensator 10. Also, by combination of this laser interferometric measurement device with the X stage 3 and the Y stage 1, a stage device is provided.

In the exposure system of this embodiment, a pattern is transferred by exposure to a wafer, as held by the wafer chuck 32, forwardly as viewed in FIG. 2 (normal to the sheet of the drawing of FIG. 2). Such exposure process may use X-rays or ultraviolet rays to print a mask pattern on a wafer, or a method in which and electron beam is deflected to directly draw a pattern on a wafer. Since a semiconductor device is manufactured by repeating the pattern transfer process to many layers, an extraordinarily high precision is required in respect to the positioning of a mask and a wafer or the positioning of a wafer and an exposure beam, namely, the positioning of the X stage 3 and the Y stage 1.

For high precision positioning of the X stage 3 at a certain target position, the host computer 24 supplies a corresponding target value signal to the signal processing circuit 22. In response, the signal processing circuit 22 calculates a difference between the target value and the current position of the stage, and it applies a differential signal to the servo control circuit 23. The servo control circuit 23 produces and applies corresponding pulses to the stage actuator, for moving the X stage 3, whereby the X stage 3 is moved.

As has been described with reference to FIG. 1, due to the Doppler phenomenon of the frequency f1, in the interference beam 17 of the X-axis interferometer 9 there is produced an increase or decrease of $\Delta f1$ in accordance with the movement direction of the X-shaped mirror 5. This change is transformed by the receiver 20 into and electrical measurement signal. A Phase detector provided in the signal processing circuit 22 calculates a phase difference between this measurement signal from the receiver 21 and the reference signal from the laser tube 11. The phase difference is integrated by an accumulator of the signal processing circuit 22, whereby the amount of movement of the X stage 3 is calculated. The feedback control is normally done so a reduce, to zero, the difference between the thus calculate value and the target value. In this operation, during the period in which the X stage 3 moves from the current position to the designated target position, any change in wavelength of the laser is measured continuously or at suitable intervals by the wavelength compensator 10 and, on the basis of this, correction of the measure value o the X-axis interferometer (and thus correction of X stage moving signal) is performed.

For example, a designated value for attaining movement of the X stage 3 of and amount L under the ambience wavelength $\lambda_{n1}$ is $L \cdot \lambda_v / \lambda_{n1}$. If the wavelength changes to $\lambda_{n2}$ due to a change in ambience, the movement of the X stage 3 of the same amount L can be attained by a designated value $L \cdot \lambda_v / \lambda_{n2}$.

The foregoing description concerns the positioning of the X stage out the positioning of the Y stage 1 can be performed in a similar manner.

If, for example, soft X-rays of a few to a few ten angstroms are used as exposure energy, high purity He ambience has to be maintained as the exposure ambience in order to reduce the attenuation of X-rays and to improve the uniformity of linewidth. To this end, the He chamber 7 is provided with the vacuum pump 110 as described and, in this embodiment, this vacuum pump 110 can be used in combination with the switch valve 111 also to evacuate the reference vacuum tube 106.

As described, a wavelength compensator of specific structure is used as a means for compensating a change in wavelength of measurement light, and this assures a laser interferometric measurement device by which the position of the stage can be measured correctly without being affected by the ambience around it. Further, the stage device using such laser interferometric measurement device attains high precision positioning of the stage. Still further, and exposure system using such stage device has high positioning precision of a wafer, thus enabling higher degree of integration of a microdevice.

[Second Embodiment]

In the preceding embodiment, the reference vacuum tube of the wavelength compensator is made of fused silica. The second embodiment differs from the first embodiment in the point that the reference vacuum tube is made of a material, more particularly, glass, having a helium gas permeation coefficient smaller than that of fused silica. Except for this point, the structure and operation of this embodiment is substantially the same as that of the first embodiment, and duplicate description is omitted here.

In this embodiment, the reference vacuum tube is made of a material, e.g., glass material, having a helium permeation coefficient smaller than that of fused silica. More specifically, if a helium permeation coefficient is denoted by K and an absolute temperature is denoted by T, a glass material used here has a permeation coefficient not larger than $K=0.075^{\{-1.1(1000/T)-7.25\}}$ (cc×mm/sec·cm$^2$×Pa, 1 atm, 0 deg.(C.)), more preferably, a permeation coefficient smaller by not less than one figure than the above. Using such material effectively reduces leakage of helium into the reference vacuum tube, and its refractive index n=1.0 can be held stably. Thus, exactly in accordance with the operational theory using equation (4), a change in refractive index of the ambience around the wavelength compensator can be measured accurately from the integrated count N. Namely, making the reference vacuum tube by using a material (glass) having a helium permeation coefficient smaller than that of fused silica does provide the reference vacuum tube with means for reducing vacuum deterioration of the reference vacuum tube. A high precision wavelength compensator is assured in this way.

Preferable examples of glass usable as the vacuum tube are: Pyrex. (trade mark), boro-silicated glass, phosphate glass, soda lime glass, silicate alumina glass, X-ray shield glass, and boric lead glass. These materials have superior permeation characteristic to a gas having a larger atomic number than that of helium, and thus good results are attainable in any ambience except hydrogen.

In this embodiment, vacuum evacuating means such as used in the first embodiment is not always necessary, but if used the vacuum condition can be maintained with higher precision.

[Third Embodiment]

Figure 3:
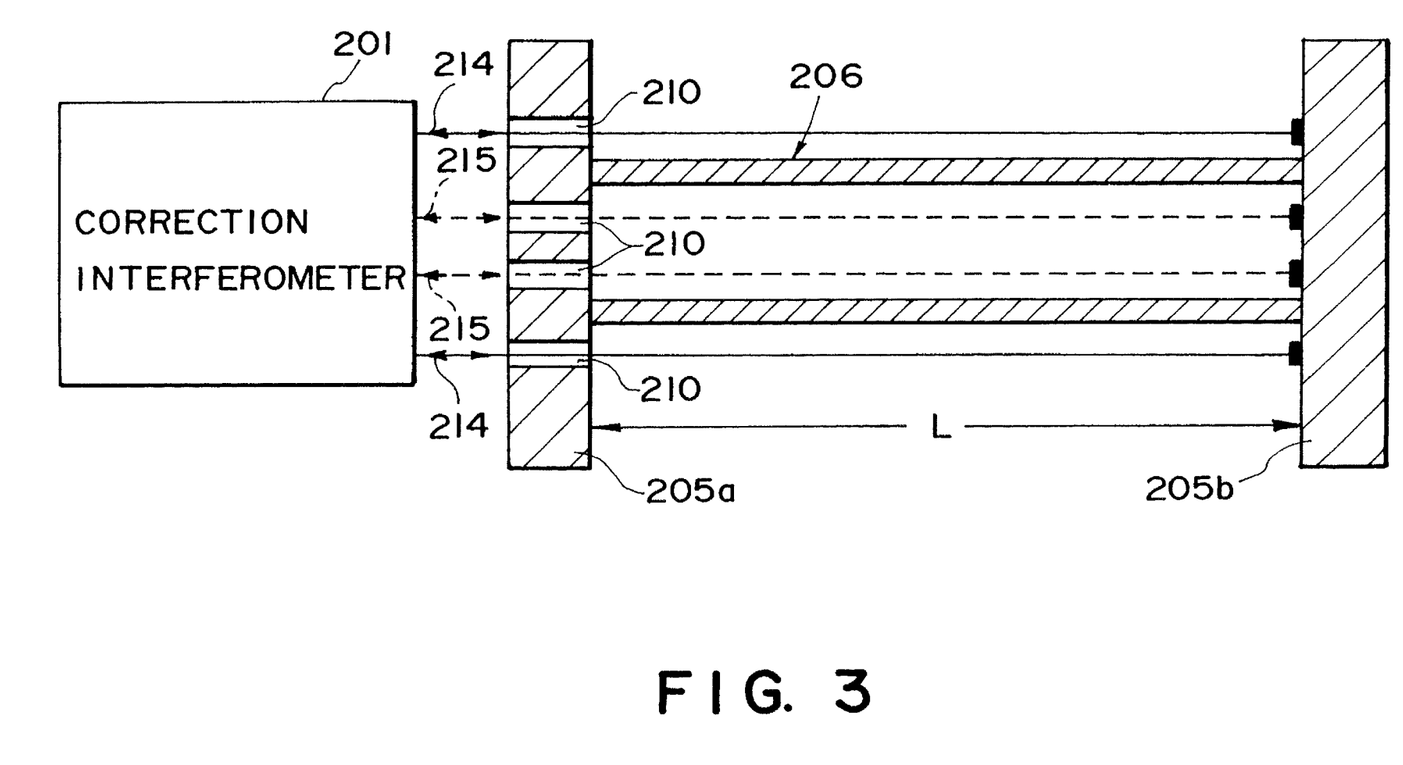
FIG. 3 is a schematic view of a wavelength compensator according to a third embodiment of the present invention.

FIG. 3 is a schematic view of a wavelength compensator according to a third embodiment of the present invention. FIG. 3 illustrates a reference vacuum tube 206 and a correction interferometer 201. In order to avoid duplicate description, explanation will be made mainly on the difference of this embodiment to the first embodiment.

In this embodiment, the reference vacuum tube 206 is made of metal having a small helium permeation coefficient as compared with that of fused silica. Also, in a portion of one of flanges 205a and 205b of the reference vacuum tube 206, on or from which portion a measurement beam 214 or a reference beam 215 impinges or exits, a laser light transmitting window 210 made of a laser beam transmissible material is provided, as illustrated. With respect to rare gases such as helium, metal has a permeation coefficient smaller than that of fused silica. Thus, making a major portion of the reference vacuum tube 206 by using metal enables to provide a wavelength compensator in which vacuum of its reference vacuum tube can be maintained satisfactorily. Namely, making a major portion of the reference vacuum tube 206 by using a metal material having a small helium permeation coefficient as compared with that of fused silica, does provide the reference vacuum tube 206 with means for reducing vacuum deterioration of the reference vacuum tube 206. A high precision wavelength compensator is thus assured.

A preferable example of metal to be used for the reference vacuum tube 206 is surface treated stainless steel or aluminum, generally used for a vacuum chamber and having a small gas emission quantity. As for the laser light transmitting window 210, it may preferably be made of a glass material, for example, having a low transmissivity to helium but having a high transmissivity to visible light.

[Fourth Embodiment]

Figure 4:
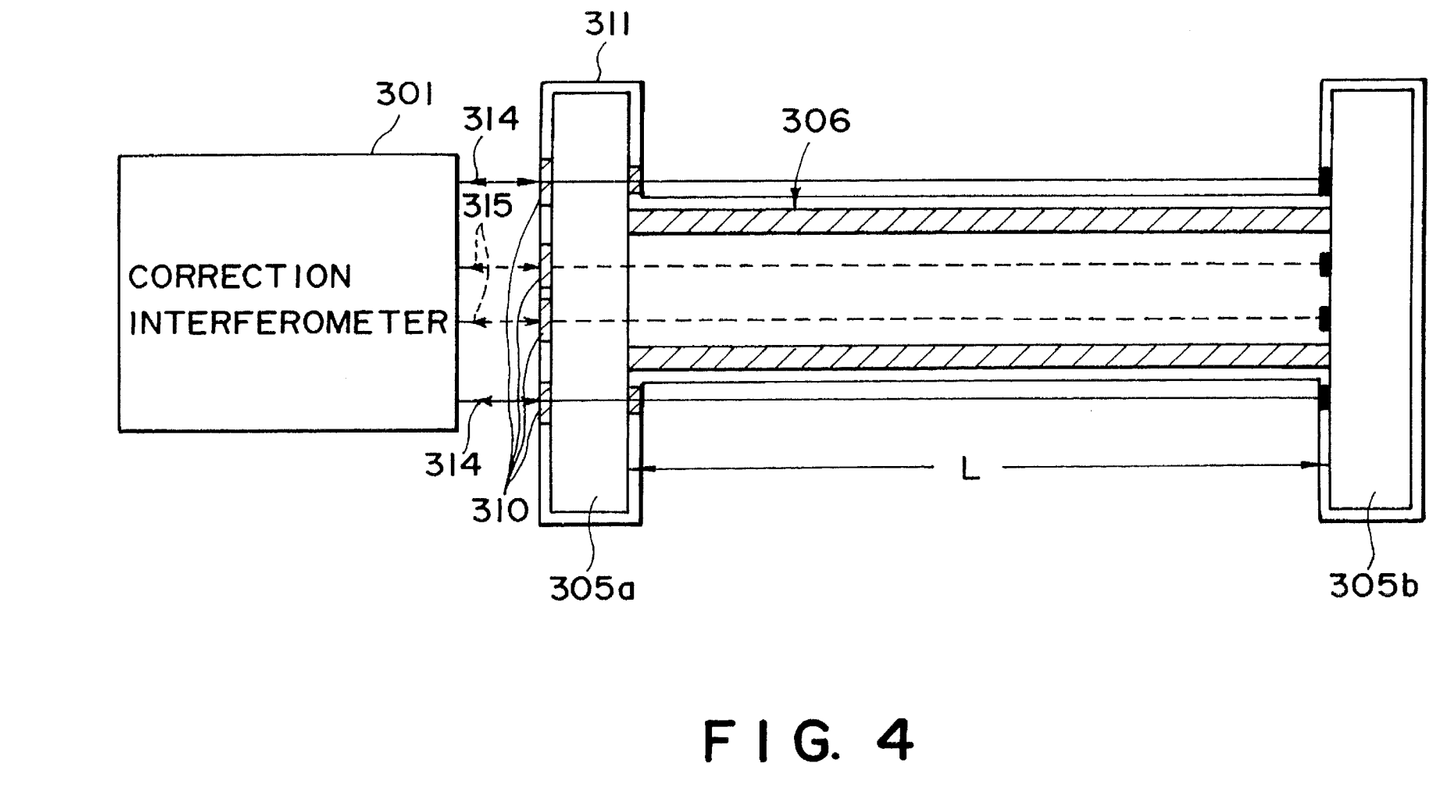
FIG. 4 is a schematic view of a wavelength compensator according to a fourth embodiment of the present invention.

FIG. 4 is a schematic view of a wavelength compensator according Lo a fourth embodiment of the present invention. FIG. 4 illustrates a reference vacuum tube 306 and a correction interferometer 301. In order to avoid duplicate description, explanation will be made mainly of the difference of this embodiment to the first embodiment.

In this embodiment, the reference vacuum tube 306 is made of fused silica, but the peripheral surface thereof is coated with a material (e.g. glass or metal) 311 having a small helium permeation coefficient. In a portion of one of flanges 305a and 305b of the reference vacuum tube 306, on or from which portion a measurement beam 314 or a reference beam 315 impinges or exits, a laser light transmitting window 310 made of a laser beam transmissible material is provided, as illustrated. Each laser beam transmitting window 310 may preferably be made of a material (e.g. glass) having a low transmissivity to helium but having a high transmissivity to visible light. Where metal is to be used as the coating material 311, it may be applied by evaporation, for example.

As described, even in an occasion where the reference vacuum tube is made of fused silica, coating the outside of it with a coating material (311) having a smaller helium permeation coefficient than that of fused silica enables the user to provide a wavelength compensator having small helium leakage into the reference vacuum tube if it is placed in a helium ambience. Namely, coating the periphery of the reference vacuum tube 306 with a material having a smaller helium permeation coefficient than fused silica provides the reference vacuum tube with means for reducing vacuum deterioration of the reference vacuum tube. A high precision wavelength compensator is thus assured.

In this embodiment, laser transmitting windows 310 each made of a laser beam transmissible material are provided each in a portion on or from which the measurement beam 314 or reference beam 315 impinges or exits. However, if the coating material 310 has a good laser transmissivity, the laser transmitting windows may be omitted and the whole peripheral side of the reference vacuum tube 306 may be covered by the coating material 311.

[Fifth Embodiment]

Figure 5:
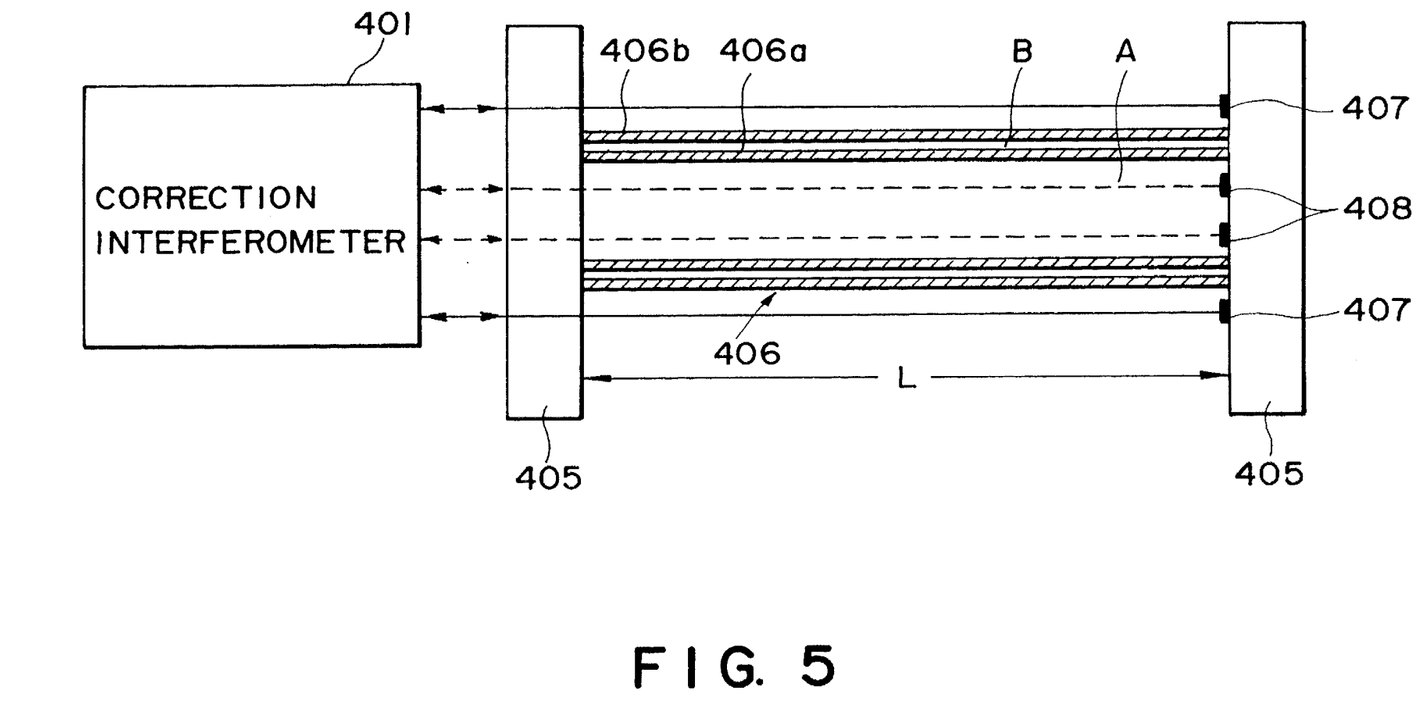
FIG. 5 is a schematic view of a wavelength compensator according to a fifth embodiment of the present invention.

FIG. 5 is a schematic view of a wavelength compensator according to a fifth embodiment of the present invention. FIG. 5 illustrates a reference vacuum tube 406 and a correction interferometer 410. In order to avoid duplicate description, explanation will be made mainly on the difference of this embodiment to the first embodiment.

In this embodiment, the cylindrical portion of the reference vacuum tube 406 has a dual wall structure having a first partition wall 406a and a second partition wall 406b surrounding the first wall. Vacuum is maintained in the space A encircled by the first partition wall 406a. On the other hand, the space B defined between the first partition wall 406a and the second partition wall 406b is filled with a gas having a larger atomic number than that of helium. Thus, target mirrors 408 placed in vacuum are located inside the first partition wall 406a, while target mirrors 407 placed in all ambience are located outside the second partition wall 406b. The space B closed by the first and second partition walls 406a and 406b may preferably be maintained at a pressure substantially equal to the outside ambience pressure.

By making the cylindrical portion of the reference vacuum tube 406 into a dual wall or dual cylinder structure, it is possible to provide a wavelength compensator having small helium leakage into its reference vacuum tube even if it is placed in a helium ambience. While a dual-wall cylinder is used as the reference vacuum tube 406 in this embodiment, a multiplex or multi-wall structure having more than two cylindrical walls may be used. Further, in addition to the cylindrical portion of the tube, the flanges 405 may be made of dual-wall or multi-wall structure. Thus, in this embodiment, making the reference vacuum tube 406 into a multiplex structure does provide the reference vacuum tube with means for reducing vacuum deterioration of the same. A high precision wavelength compensator is thus assured.

Next, an embodiment of a device manufacturing method using an exposure system such as described hereinbefore will be explained.

Figure 6:
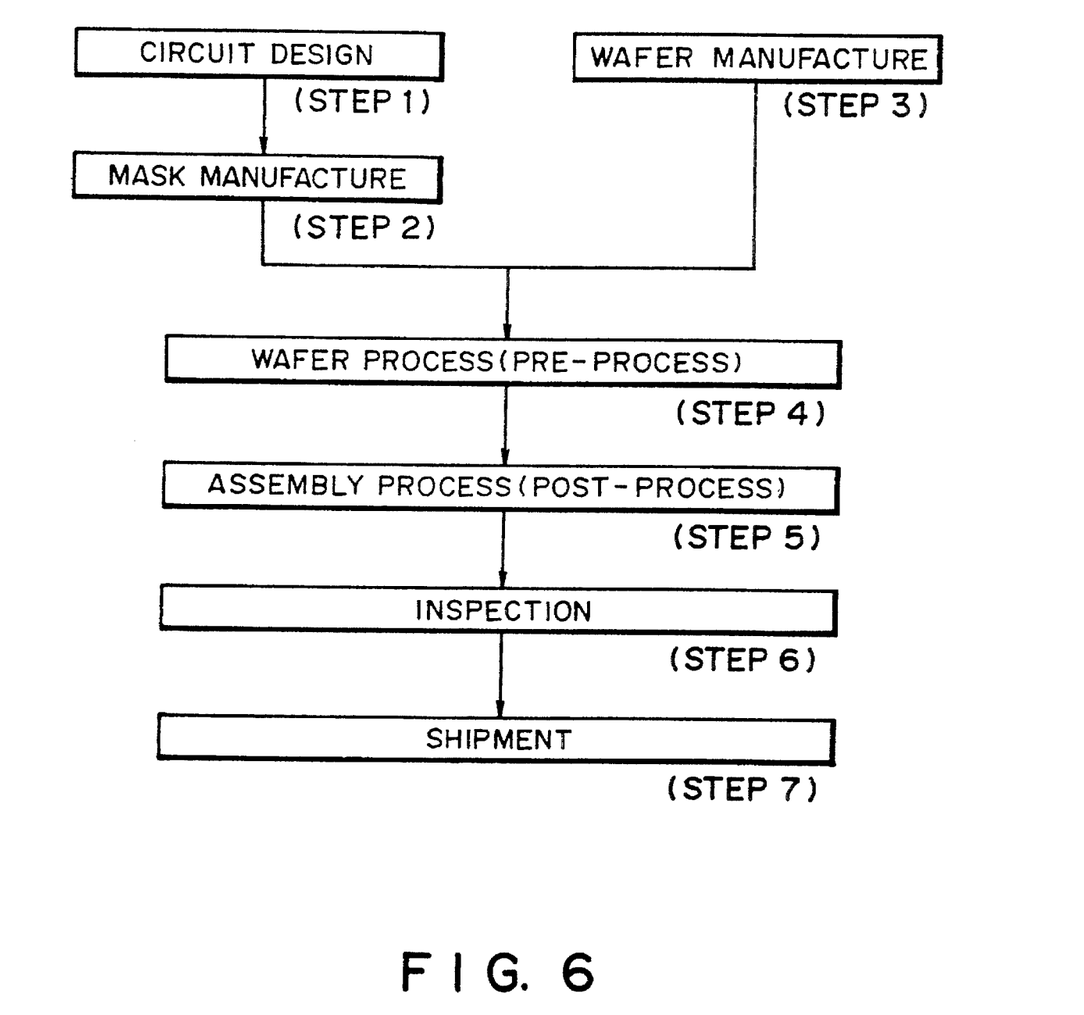
FIG. 6 is a flow chart of device manufacturing processes.

FIG. 6 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 7:
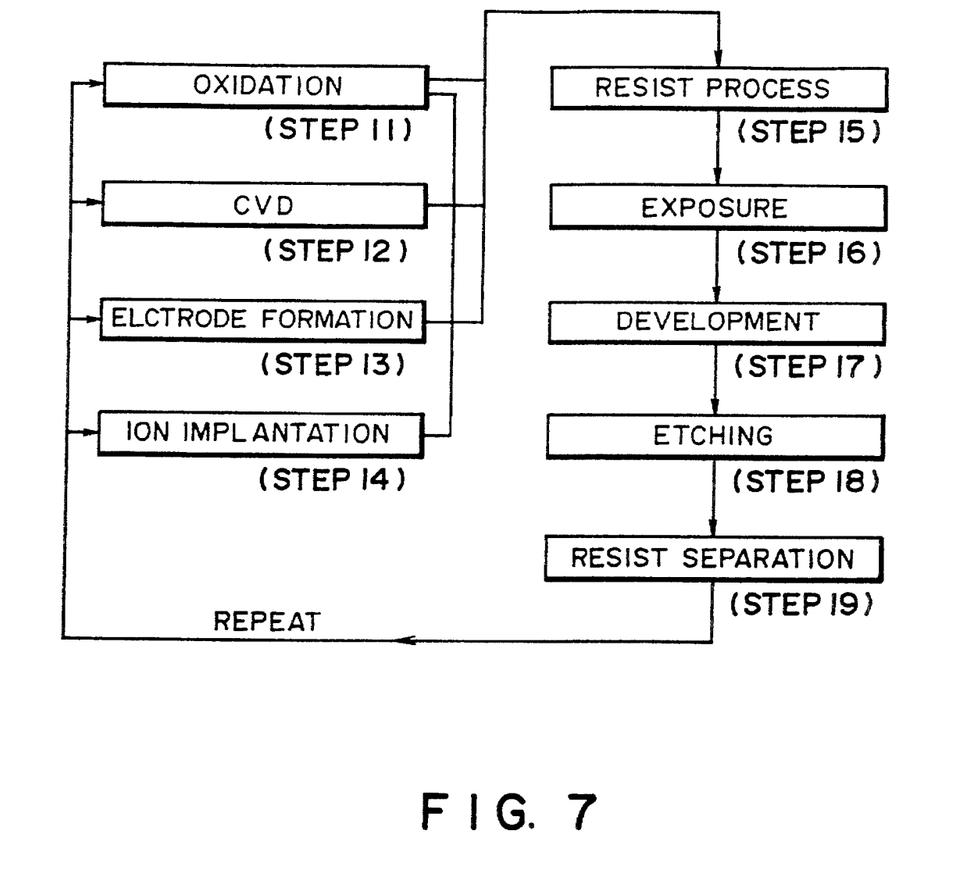
FIG. 7 is a flow chart of a wafer process.

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confirmed to the details set forth and this application is intended to cover such modifications or changes as may come within the purposes of the improvements or the scope of the following claims.

What is claimed is:

1. A wavelength compensator in a helium ambience, comprising:
   a reference vacuum tube disposed in the helium ambience and having closed ends, wherein a laser beam enters said reference vacuum tube from one of the ends thereof and is reflected by the other end backwardly;
   interference means for causing interference of the laser beam to produce an interference beam;
   receiving means for receiving the interference beam which bears information related to a change in wavelength of the laser beam; and
   means for reducing deterioration in vacuum of said reference vacuum tube.

2. A wavelength compensator according to claim 1, wherein said interference means serves to divide a laser beam into a reference beam passing through said reference vacuum tube and a measuring beam not passing through said reference vacuum tube, and to cause interference between the reference beam and the measuring beam.

3. A wavelength compensator according to claim 1, wherein said deterioration reducing means includes vacuum evacuating means mounted on said reference vacuum tube.

4. A wavelength compensator according to claim 1, wherein said deterioration reducing means uses, as a material of said reference vacuum tube, a material having a small helium permeation coefficient as compared with that of fused silica.

5. A wavelength compensator according to claim 4, wherein the used material comprises a glass material having a small helium permeation coefficient as compared with that of fused silica.

6. A wavelength compensator according to claim 4, wherein the used material comprises a metal material having a small helium permeation coefficient as compared with that of fused silica, and wherein a portion of said vacuum tube to be passed by the laser beam is made of a material through which the laser beam can pass while another portion of said vacuum tube is made of said metal material.

7. A wavelength compensator according to claim 1 wherein said deterioration reducing means comprises a coating material applied to the surface of said vacuum tube, said coating material comprising a material having a small helium permeation coefficient as compared with that of fused silica.

8. A wavelength compensator according to claim 7, wherein said coating material comprises a glass material having a small helium permeation coefficient as compared with that of fused silica.

9. A wavelength compensator according to claim 7, wherein said coating material comprises a metal material having a small helium permeation coefficient as compared with that of fused silica, and wherein a portion of said vacuum tube to be passed by the laser beam s made of a material through which the laser beam can pass while another portion of said vacuum tube is made of said metal material.

10. A wavelength compensator according to claim 1, wherein said vacuum tube comprises a multiplex structure by which said deterioration reducing means is defined.

11. A laser interferometer measuring device, comprising:
   measuring means for measuring a relationship of objects by using a laser beam; and
   a wavelength compensator for compensating a measurement error due to a change in wavelength of the laser beam, said wavelength compensator comprising:
      a reference vacuum tube disposed in a helium ambience and having closed ends, wherein a laser beam enters said reference vacuum tube from one of the ends thereof and is reflected by the other end backwardly;
      interference means for causing interference of the laser beam to produce an interference beam;
      receiving means for receiving the interference beam which bears information related to a change in wavelength of the laser beam; and
      means for reducing deterioration in vacuum of said reference vacuum tube.

12. A stage device, comprising:
   a movable stage on which an object can be placed; and
   a laser interferometer measuring device said laser interferometer measuring device comprising:
      measuring means for measuring a relationship of objects by using a laser beam: and
      a wavelength compensator, for compensating a measurement error due to a change in wavelength of the laser beam, said wavelength compensator comprising:
         a reference vacuum tube disposed in a helium ambience and having closed ends, wherein a laser beam enters said reference vacuum tube from one of the ends thereof and is reflected by the other end backwardly;
         interference means for causing interference of the laser beam to produce an interference beam;
         receiving means for receiving the interference beam which bears information related to a change in wavelength of the laser beam; and
         means for reducing deterioration in vacuum of said reference vacuum tube.

13. An exposure system, comprising:
   an exposure apparatus for exposing a substrate to be exposed; and
   a stage device on which the substrate to be exposed can be placed, said stage device comprising:
      a movable stage on which an object can be placed; and
      a laser interferometer measuring device, said laser interferometer measuring device comprising:
         measuring means for measuring a relationship of objects by using a laser beam: and
         a wavelength compensator, for compensating a measurement error due to a change in wavelength of the laser beam, said wavelength compensator comprising:
            a reference vacuum tube disposed in a helium ambience and having closed ends, wherein a laser beam enters said reference vacuum tube from one of the ends thereof and is reflected by the other end backwardly;
            interference means for causing interference of the laser beam to produce an interference beam;
            receiving means for receiving the interference beam which bears information related to a change in wavelength of the laser beam; and
            means for reducing deterioration in vacuum of said reference vacuum tube.

* * * * *

UNITED STATES PATENT AND TRADEMARK OFFICE
CERTIFICATE OF CORRECTION

PATENT NO. : 5,483,343

DATED : January 9, 1996

INVENTOR(S) : Iwamoto et al.

It is certified that error appears in the above-indentified patent and that said Letters Patent is hereby corrected as shown below:

SHEET 1:

FIG. 1, "POLARIZD" should read --POLARIZED--.

COLUMN 1:

Line 63, "ed" should read --and--; and
Line 67, "and" should read --an--.

COLUMN 2:

Line 9, "given," should read --given--; and
Line 25, "and" should read --an--.

COLUMN 3:

Line 19, "$n_1(he)=n_0+\Delta_n+[N\lambda_v/4L(2m-1)]$ ............ (9)" should read --$n_1(He)=n_0+\Delta_n+[N\lambda_v/4L(2m-1)]$ ............ (9)--;

Line 20, "$\lambda_{n1}(he)=\lambda_v/n_1(he) \neq \lambda_v/n_1$ ............... (10)" should read --$\lambda_{n1}(He)=\lambda_v/n_1(He) \neq \lambda_v/n_1$ ............... (10)--;

Line 30, "and" should read --an--;
Line 33, "and" should read --an--;
Line 35, "and" should read --an--;
Line 42, "and" should read --an--; and
Line 44, "beam:" should read --beam;--.

UNITED STATES PATENT AND TRADEMARK OFFICE
CERTIFICATE OF CORRECTION

PATENT NO. : 5,483,343
DATED : January 9, 1996
INVENTOR(S) : Iwamoto et al.

It is certified that error appears in the above-indentified patent and that said Letters Patent is hereby corrected as shown below:

COLUMN 4:

Line 25, "device" should read --device,--;
    Line 26, "placed:" should read --placed;--;
    Line 29, "and" should read --an--;
    Line 31, "exposed:" should read --exposed;--;
    Line 35, "and" should read --an--; and
    Line 64, "material," should read --material.--.

COLUMN 5:

Line 51, "o" should read --to--.

COLUMN 6:

Line 32, "thee" should read --these--;
    Line 53, "of" should read --on--;
    Line 63, "and" should read --an--; and
    Line 67, "tat" should read --that--.

COLUMN 7:

Line 9, "change" should read --changes--;
    Line 19, "a" should read --an--;
    Line 31, "and" should read --and,--;
    Line 36, "explained," should read --explained.--;
    Line 49, "describe" should read --described--; and
    Line 56, "and" should read --an--.

UNITED STATES PATENT AND TRADEMARK OFFICE
CERTIFICATE OF CORRECTION

PATENT NO. : 5,483,343　　　　　　　　　Page 3 of 4
DATED : January 9, 1996
INVENTOR(S) : Iwamoto et al.

It is certified that error appears in the above-indentified patent and that said Letters Patent is hereby corrected as shown below:

COLUMN 8:

Line 10, "respectively," should read --respectively.--; and
Line 11, "and" should read --an--.

COLUMN 9:

Line 35, "o" should read --of--;
Line 39, "and" should read --an--;
Line 45, "stage out" should read --stage, but--; and
Line 64, "and" should read --an--.

COLUMN 10:

Line 12, "c.g.," should read --e.g.,--.

COLUMN 11:

Line 15, "Lo" should read --to--.

COLUMN 12:

Line 64, "confirmed" should read --confined--.

COLUMN 13:

Line 40, "claim 1" should read --claim 1,--; and
Line 54, "s" should read --is--.

UNITED STATES PATENT AND TRADEMARK OFFICE
CERTIFICATE OF CORRECTION

PATENT NO. : 5,483,343

DATED : January 9, 1996

INVENTOR(S) : Iwamoto et al.

It is certified that error appears in the above-indentified patent and that said Letters Patent is hereby corrected as shown below:

COLUMN 14:

Line 16, "device" should read --device,--;
Line 19, "beam:" should read --beam;--; and
Line 46, "beam:" should read --beam;--.

Signed and Sealed this

First Day of October, 1996

Attest:

BRUCE LEHMAN

Attesting Officer

Commissioner of Patents and Trademarks